United States Patent
Logan et al.

(10) Patent No.: US 9,887,799 B2
(45) Date of Patent: *Feb. 6, 2018

(54) METHODS AND APPARATUS FOR DATA COMMUNICATION USING BANDWIDTH MODULATION

(71) Applicant: Raytheon Company, Waltham, MA (US)

(72) Inventors: Jeffery J. Logan, Redondo Beach, CA (US); Harry Marr, Manhattan Beach, CA (US); Tyler Miller, Gardena, CA (US)

(73) Assignee: RAYTHEON COMPANY, Waltham, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/750,101

(22) Filed: Jun. 25, 2015

(65) Prior Publication Data

US 2016/0380654 A1    Dec. 29, 2016

(51) Int. Cl.
*H04K 3/00* (2006.01)
*H03K 7/08* (2006.01)
*H04K 1/00* (2006.01)
*H04L 12/26* (2006.01)

(52) U.S. Cl.
CPC ............. *H04K 3/42* (2013.01); *H03K 7/08* (2013.01); *H04K 3/28* (2013.01); *H04K 2203/32* (2013.01); *H04L 43/087* (2013.01)

(58) Field of Classification Search
CPC ......... H04L 1/205; H04L 1/206; H04L 27/38; H04L 27/36; H04L 43/087; G01R 31/31709; G01S 7/38; H03C 3/0966; H03M 1/0836; H04K 3/28; H04K 3/42; H04K 2203/32; H03K 7/08
See application file for complete search history.

(56) References Cited

U.S. PATENT DOCUMENTS

| | | | |
|---|---|---|---|
| 2,556,457 A | 6/1951 | Watts | |
| 4,105,868 A * | 8/1978 | Takahashi | H04H 20/49 381/16 |
| 4,345,323 A | 8/1982 | Chang | |
| 4,642,644 A | 2/1987 | Wise et al. | |
| 5,134,386 A * | 7/1992 | Swanic | G08B 13/10 250/227.16 |

(Continued)

FOREIGN PATENT DOCUMENTS

| | | |
|---|---|---|
| EP | 1 600 784 A1 | 11/2005 |
| WO | WO 81/02470 A1 | 9/1981 |
| WO | WO 2010/032237 A1 | 3/2010 |

OTHER PUBLICATIONS

U.S. Appl. No. 14/751,193, filed Jun. 26, 2015, Logan et al.

(Continued)

*Primary Examiner* — Michelle M Koeth
(74) *Attorney, Agent, or Firm* — Daly, Crowley Mofford & Durkee, LLP

(57) ABSTRACT

Methods and apparatus to determine a level of inherent jitter for signals from a transmitter and a receiver, and modulate information onto a signal transmitted by the transmitter by using spot jitter (with bandwidth and center frequency modulation) and/or pulse width jitter in a region outside of a data region with inherent jitter to carry communication between systems.

19 Claims, 12 Drawing Sheets

(56) References Cited

U.S. PATENT DOCUMENTS

| | | | |
|---|---|---|---|
| 5,254,843 A * | 10/1993 | Hynes | G06K 7/084 |
| | | | 235/449 |
| 5,254,853 A | 10/1993 | Reich | |
| 5,506,582 A | 4/1996 | Lawsine | |
| 7,436,877 B2 | 10/2008 | Karlsson | |
| 7,697,885 B2 | 4/2010 | Stoddard | |
| 8,467,441 B2 | 6/2013 | Sawaoka et al. | |
| 2002/0136281 A1* | 9/2002 | Grohn | H04L 5/16 |
| | | | 375/219 |
| 2003/0139165 A1* | 7/2003 | Smith | G06F 17/148 |
| | | | 455/296 |
| 2005/0075810 A1* | 4/2005 | Laquai | G01R 31/31709 |
| | | | 702/69 |
| 2006/0164282 A1 | 7/2006 | Duff et al. | |
| 2008/0224874 A1* | 9/2008 | Rodgers | H01Q 1/2283 |
| | | | 340/572.7 |
| 2009/0009379 A1 | 1/2009 | Olsson | |
| 2010/0111222 A1* | 5/2010 | Schimper | H04L 27/367 |
| | | | 375/296 |
| 2010/0222002 A1* | 9/2010 | Lys | H04B 1/0067 |
| | | | 455/63.1 |
| 2010/0283656 A1* | 11/2010 | Zavrel, Jr. | G01S 7/38 |
| | | | 342/14 |
| 2011/0148585 A1* | 6/2011 | Bae | G06K 7/0008 |
| | | | 340/10.1 |
| 2012/0326789 A1* | 12/2012 | Bouyat | G01D 3/021 |
| | | | 330/278 |
| 2015/0319061 A1* | 11/2015 | Kowalevicz | H04L 9/16 |
| | | | 709/224 |

OTHER PUBLICATIONS

U.S. Appl. No. 14/751,193 Office Action dated Mar. 22, 2016, 20 pages.
U.S. Notice of Allowance dated Oct. 5, 2016 corresponding to U.S. Appl. No. 14/751,193; 7 pages.
Notification of Transmittal of the International Search Report and the Written Opinion of the International Searching Authority, or the Declaration, PCT/US2016/027454, dated Jul. 14, 2016, 6 pages.
Written Opinion of the International Searching Authority, PCT/US2016/027454, dated Jul. 14, 2016, 6 pages.
U.S. Appl. No. 14/751,193 Amendment filed Sep. 22, 2016, 18 pages.
Carlos Azeredo-Leme: "Clock Jitter Effects on Sampling: A Tutorial"; *IEEE Circuits and Systems Magazine*, Aug. 25, 2011, pp. 26-37 (12 pages).

* cited by examiner

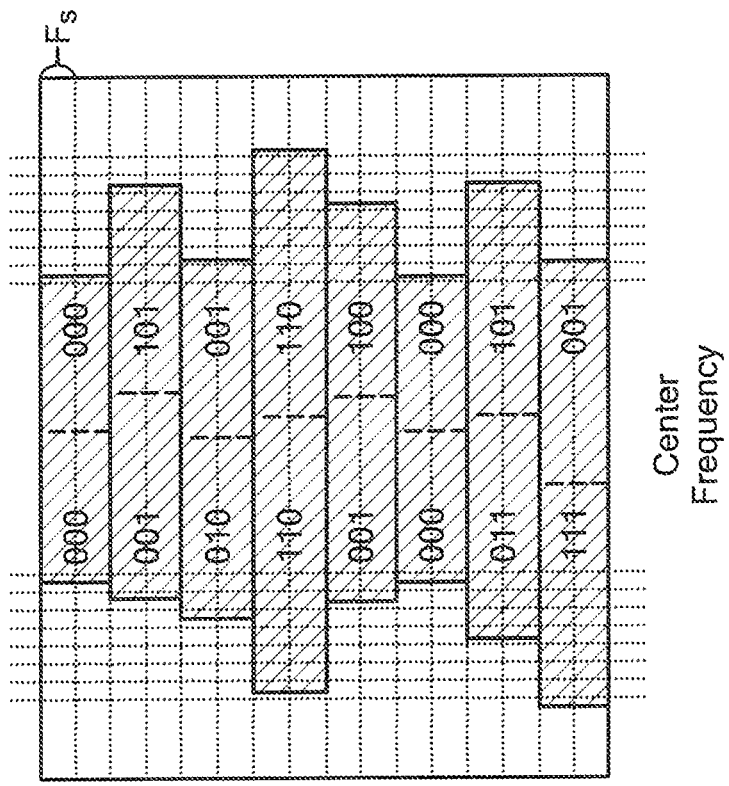
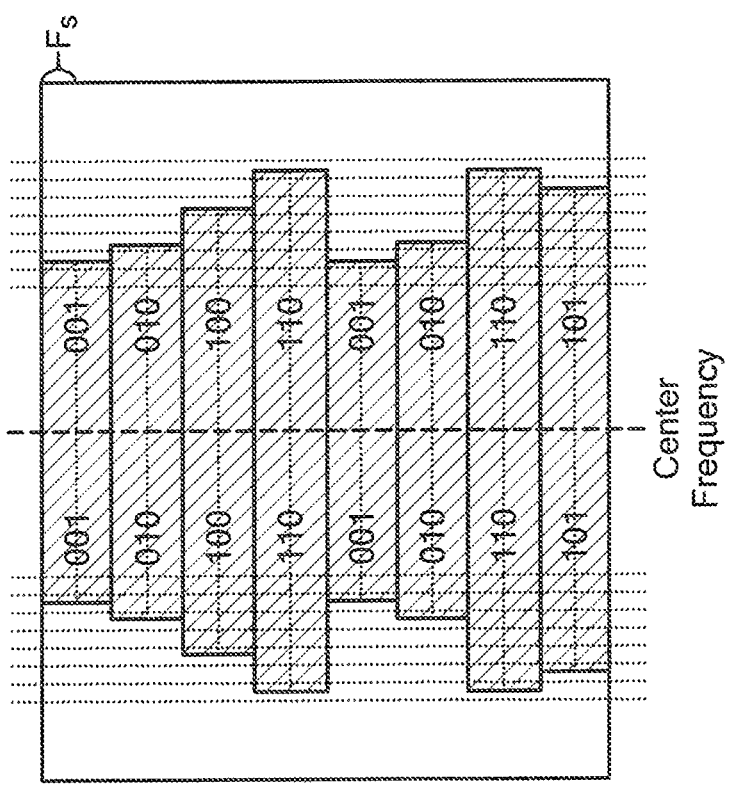
FIG. 5C
FIG. 5D

METHODS AND APPARATUS FOR DATA COMMUNICATION USING BANDWIDTH MODULATION

BACKGROUND

As is known in the art, while jamming signals of an adversary, friendly nearby systems are also prevented from using the same bandwidths that are being jammed. Since many communications systems use the same methods for communicating, it may not be possible to allow one to operate while disabling the other. Conventional techniques of communicating while jamming involve separating the signals in either the time or frequency domain. Either the communications are sent during times the jamming signal is turned off, or a small band is left unjammed for the communications system to use. However, this allows the adversary to use the same technique to communicate if they can determine the right time/frequency.

SUMMARY

The present invention provides method and apparatus for adding communication data onto a jamming signal by varying pulse parameters. A jammer can be modeled to look like pure noise in order to make it difficult to filter out. In embodiments of the invention, the jamming signal still appears as noise to an adversary, while still conveying useful data to an ally. In general, jamming effectiveness remains unaffected. It is understood that embodiments of the invention are applicable to continuous waveforms, such as noise, and non-continuous waveforms, e.g., coherent waveforms, and polymorphic waveforms by modulating the bandwidth (BW), center frequency (CF), and pulse width (PW) as appropriate to embed communications.

Embodiments of the invention enable communication data to be modulated onto a jamming waveform, thereby removing the need to separate one signal from the other at the receiver. Digital bits are represented by small changes, or jitters, in the jamming signal spot coverage (bandwidth) and/or pulse-width. These jitters are large enough to be detected, but small enough to allow the jamming to maintain effectiveness against the adversary. In embodiments, jitter is controlled such that a threat system does not have sufficient sensitivity to observe the jitter communications, while a friendly system maintains the capability to detect the jitter communications. Main-lobe jam energy is applied to the target, while side-lobe energy is used to communicate with friendly aircraft via the jitters placed within the waveform. In embodiments, this could work while the friendly aircraft is in the main-lobe.

In one aspect of the invention, a method of data jitter to modulate data onto a signal comprises: modulating a data jitter value above a threshold corresponding to a sum of inherent spot jitter and inherent transmission error to generate an output signal; and transmitting the output signal with a transmitter.

The method can further include one or more of the following features: modulating a center frequency to generate the output signal, modulating a center frequency to provide the output signal having first and second channels, modulating different data jitter values on each side of the signal to generate the output signal, encrypting the output signal, determining signal characteristics between the transmitter and a receiver including the inherent spot jitter, directing a signal lobe at the receiver, the data jitter has a corresponding number of states, the signal comprises a continuous waveform signal, adjusting the threshold to achieve a given signal-to-noise ratio, determining a number of states for transmitting the output signal, receiving the transmitted signal and demodulating the data jitter value, communicating with a receiver to determine the threshold, dynamically adjusting the threshold, and/or modulating a pulse width jitter value onto the signal in a buffer area adjacent to a pulse edge of the signal having inherent jitter to generate the output signal.

In another aspect of the invention, a system comprises: a module configured to modulate a data jitter value onto a signal above a threshold corresponding to a sum of inherent spot jitter and inherent transmission error for generating an output signal for transmission by a transmitter.

The system can further include one or more of the following features: modulating a center frequency to generate the output signal, modulating a center frequency to provide the output signal having first and second channels, modulating different data jitter values on each side of the signal to generate the output signal, encrypting the output signal, determining signal characteristics between the transmitter and a receiver including the inherent spot jitter, directing a signal lobe at the receiver, the data jitter has a corresponding number of states, the signal comprises a continuous waveform signal, adjusting the threshold to achieve a given signal-to-noise ratio, determining a number of states for transmitting the output signal, receiving the transmitted signal and demodulating the data jitter value, communicating with a receiver to determine the threshold, dynamically adjusting the threshold, and/or modulating a pulse width jitter value onto the signal in a buffer area adjacent to a pulse edge of the signal having inherent jitter to generate the output signal.

In a further aspect of the invention, a system comprises: a module configured to demodulate a data jitter value modulated onto a signal above a threshold corresponding to a sum of inherent spot jitter and inherent transmission error. The system can be further configured to demodulate a modulated center frequency providing first and second channels.

In another aspect of the invention, a method of pulse width jitter to modulate data onto a signal, comprises: modulating a pulse width jitter value onto the signal in a buffer area adjacent to a pulse edge of the signal having inherent jitter to generate an output signal; and transmitting the output signal with a transmitter.

The method can further include one or more of the following features: modulating a center frequency to generate the output signal, modulating a center frequency to provide the output signal having first and second channels, modulating different data jitter values on each side of the signal to generate the output signal, encrypting the output signal, determining signal characteristics between the transmitter and a receiver, directing a signal lobe at the receiver, the signal comprises a non-continuous waveform signal, adjusting the buffer area to achieve a given signal-to-noise ratio, receiving the transmitted signal and demodulating the pulse width jitter value, communicating with a receiver to determine the buffer area, dynamically adjusting the buffer area, and/or modulating a data jitter value above a threshold corresponding to a sum of inherent spot jitter and inherent transmission error to generate the output signal.

In another aspect of the invention, a system comprises: a module configured to modulate a pulse width jitter value onto a signal in a buffer area adjacent to a pulse edge of the signal having inherent jitter to generate an output signal.

The system can further include one or more of the following features: modulating a center frequency to generate the output signal, modulating a center frequency to provide the output signal having first and second channels, modulating different data jitter values on each side of the signal to generate the output signal, encrypting the output signal, determining signal characteristics between the transmitter and a receiver, directing a signal lobe at the receiver, the signal comprises a non-continuous waveform signal, adjusting the buffer area to achieve a given signal-to-noise ratio, receiving the transmitted signal and demodulating the pulse width jitter value, communicating with a receiver to determine the buffer area, dynamically adjusting the buffer area, and/or modulating a data jitter value above a threshold corresponding to a sum of inherent spot jitter and inherent transmission error to generate the output signal.

In a further aspect of the invention, a system comprises: a module configured to demodulate a pulse width jitter value modulated onto a signal in a buffer area adjacent to a pulse edge of the signal having inherent jitter to generate an output signal. The system can further include the module being further configured to demodulate a modulated center frequency providing first and second channels, and/or the module being further configured to modulate a data jitter value onto the signal above a threshold corresponding to a sum of inherent spot jitter and inherent transmission error for generating an output signal for transmission by a transmitter.

BRIEF DESCRIPTION OF THE DRAWINGS

The foregoing features of this invention, as well as the invention itself, may be more fully understood from the following description of the drawings in which:

FIGS. 5A and 5B show eight states on both sides of a modulated waveform and FIGS. 5C and 5D shows the modulated waveforms of FIGS. 5A and 5B with a modulated center frequency;

DETAILED DESCRIPTION

Figure 1:
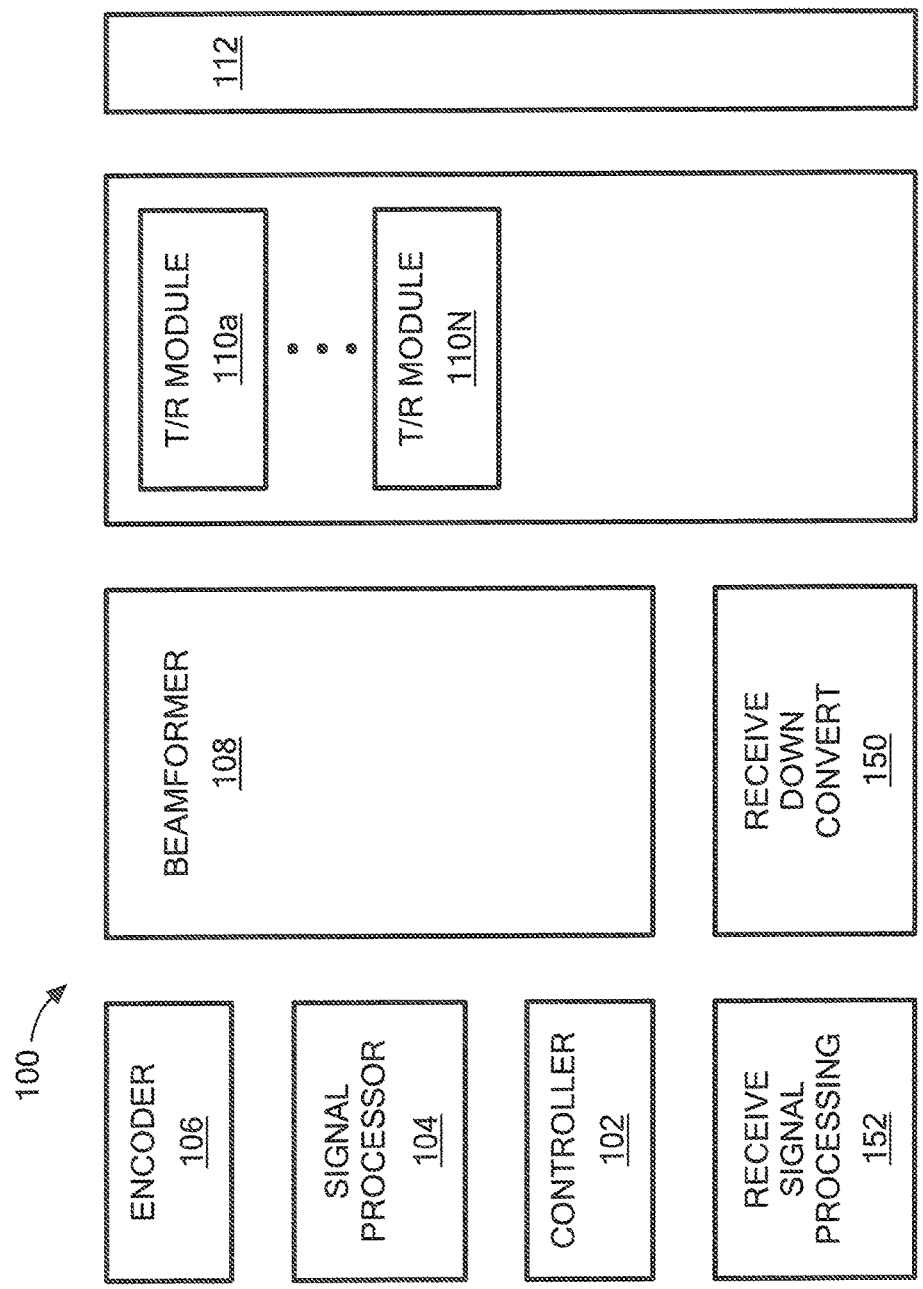
FIG. 1 is a schematic representation of a bandwidth communication system.

FIG. 1 shows an illustrative system 100 for transmitting signals having bandwidth modulation in accordance with illustrative embodiments of the invention. A controller 102 controls overall operation of the system. A signal processor module 104 processes information to be transmitted after an encoder module 106 performs bandwidth modulation, as described more fully below. A beamformer 108 receives the information to be transmitted and steers one or more beams in a desired direction. A series of transmit/receive (TR) modules 110a-N are coupled to an antenna 112 for transmitting the information into free space. In illustrative embodiments, the antenna is provided as an active electronically scanned array (AESA) antenna and the TR modules 110 include both amplitude and phase adjustment circuits (e.g. amplifiers and or phase shifting elements) as is generally known. Amplitude and phase setting in either or both of beamformer 108 and TR modules 110 are selected to provide an AESA antenna having a desired radiation pattern and beam pointing direction for one or more beams.

Received signals are provided to a receiver 150 that downconverts the frequency of the received signals for processing by a receive signal processor 152. For example, the receive signal processor 152 may process the downconverted receive signals to extract the position, velocity, direction of motion, and/or type of target.

Figure 2:
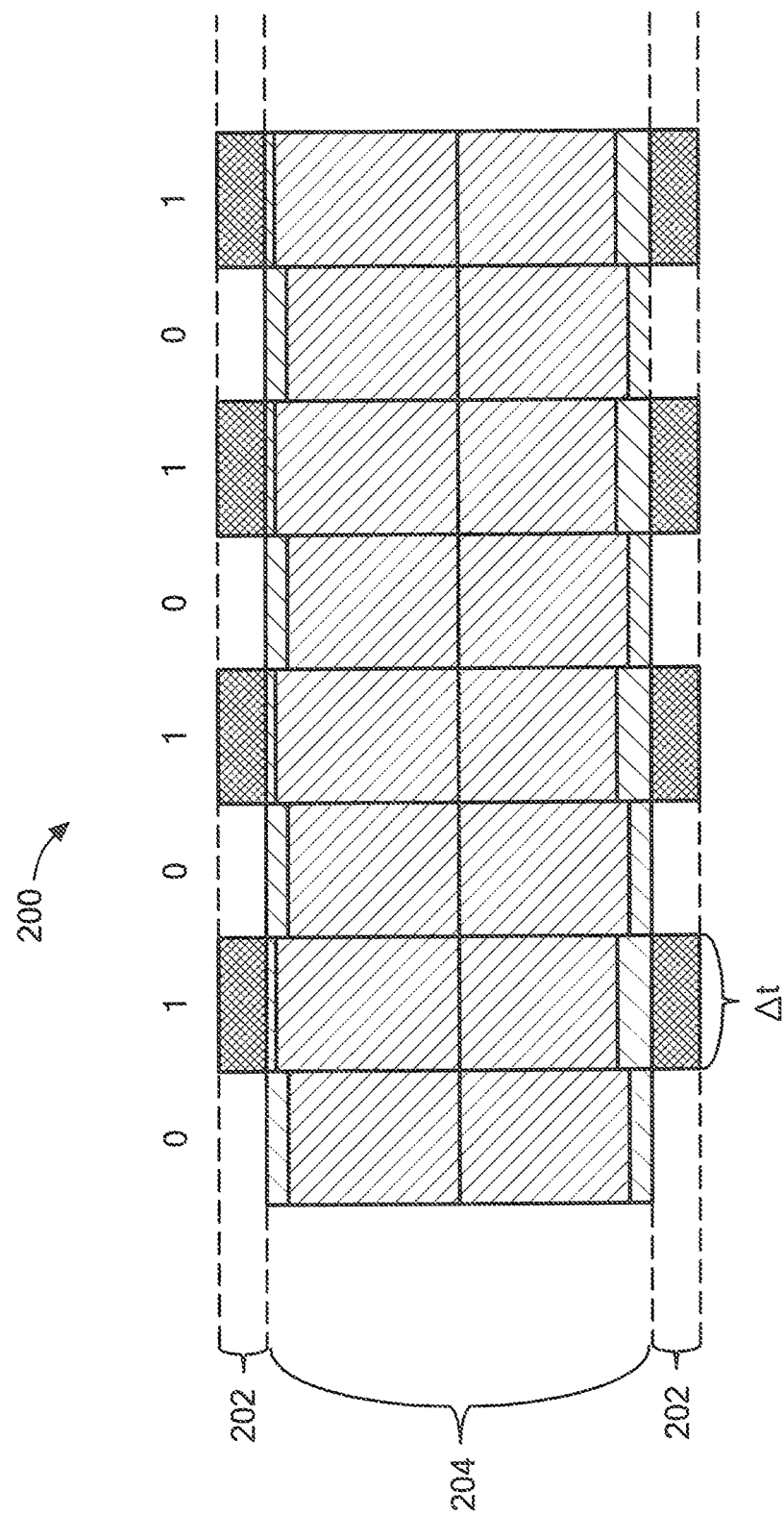
FIG. 2 is a schematic representation of data jitter communication.

FIG. 2 shows an illustrative implementation of what is referred to herein as data jittering 200 in a CW (continuous waveform) application in which a signal is periodically sampled in a jamming environment. Data jitter 202 is communicated as ones and zeroes over an inherent spot jitter. There is some level of error inherent in detecting signals. Jitter can be random or deterministic. In embodiments, data jitter value 202 is added slightly above a level 204 corresponding to a sum 204 of the inherent spot jitter level and the system inherent transmission error. The data jitter 202 is controlled so as to provide a one or a zero for enabling data communication in the presence of jamming signals or generally during waveform transmission since this could be more than just a 'jamming signal.'

Figure 3:
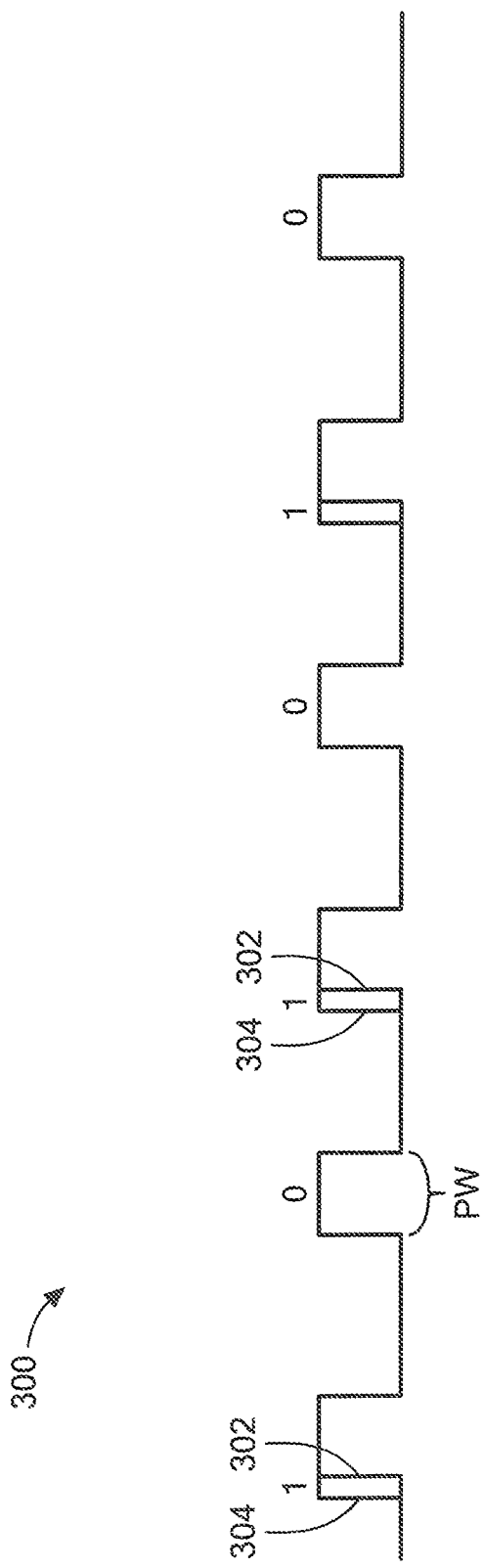
FIG. 3 is a schematic representation of spot jitter communication.

FIG. 3 shows an illustrative implementation of what is referred to herein as pulse width jitter 300. In general, pulse width jittering is suitable for non-CW modulation techniques. It is understood that during the pulse, BW jitter can also be performed. The PW jitter allows one to jitter the time of transmission for a given time, while the BW jitter can occur at a significantly faster rate during that shorter pulse. It should be noted that the data rate is significantly higher by combining jitter techniques on a non-CW waveform. Pulses contain an inherent jitter 302 at the location of the beginning and ending of a given pulse. A relatively small buffer 304 is added to a pulse edge to indicate a one or a zero. The buffer 304 is adjacent to the earliest (or latest) time the signal pulse (with inherent jitter) can occur.

In general, a main lobe or side lobe of sufficient energy from the transmitter is pointed towards receiver. A 'norm' is established by the receiver of what the normalized signal "chip" is with no communications modulation. This can be normalized "spot width" in the case of spot jitter or normalized "pulse width" in the case of pulse width jitter. A priori, an "error range" is established between transmitter and receiver systems of expected pulse width jitter or spot width jitter. In other embodiments, an error range is dynamically adjusted. Once a normalization period has been established, any change in received signal above the error range is interpreted as data communication. Changes include the received spot width (SJ) or pulse width (PWJ) or both simultaneously (SJ+PWJ).

In an embodiment, the number of bits per "chip" can be determined as follows:

$$\text{Num}_{bits} = \log_2(M) = \log_2 \text{jitter\_range/jitter\_resolution})$$

where M is the number of states, jitter_range is the data jitter that can be applied by the transmitter beyond the "error range," and jitter resolution is the resolving ability of the receiver, which is lower bounded by the actual jitter in the system. It is understood that while FIGS. 2 and 3 show a single 0 or 1 state on each bit, there can be multiple steps, for example as shown in FIGS. 5A-D.

The bit error rate can arise from frequency agile threats and the application of CW techniques to that threat. However, the spot jittering can be re-synced with minimal lost bits. It is understood that Forward Error Correction (FEC) or any suitable technique can be used to determine these lost bits. If however, a significant number of bits have been lost and FEC cannot properly disambiguate the signal, then the signal can be repeated with larger jitter values. By dynamically adjusting the jitter values to converge to a sufficient jitter Signal-to-Noise Ratio (SNR), the system can ensure the jitter communications link is established between systems. Finally, the jitter value would have an upper bound defined limiting the degradation to the primary mission.

The loss in PSD (power spectral density) is relatively minimal since the jitter magnitude can be a small multiple of the minimal transmit and receive tone width of the system.

In general, PW Jitter (PWJ) is suited to non-CW techniques. PWJ applies a slight buffer to the pulse widths to create a 0 or 1. PWJ works as intended while simultaneously transmitting data to "in the know" receivers. Bit Error Rate (BER) can derive agile PWs; however, it can quickly be re-synched. Existing processing techniques can determine these lost bits. If multiple non-CW techniques are interleaved, this communication technique can be superimposed between those techniques.

A new chip for pulse width jitter (PWJ) is resolved each sampling clock cycle and a new chip is resolved on spot width jitter every two sampling clock cycles to meet Nyquist criteria, for example. With pulse width (PW), and pulse repetition frequency (PRF), and where M states can be established, the communications rate with PWJ is then:

$$Bit_{rate\_sj} = PRF \cdot \log_2 M$$

For spot jitter (SJ), with sampling rate Fs, and duty factor (Duty) and M states, the communications rate with SJ is then $$Bit_{rate\_pwj} = 2 \cdot \left(\frac{Fs}{2}\right) \cdot \log_2 M \cdot Duty$$

It is understood that the "2" in the above equation is present because when performing spot jitter it is assumed there is jittering of both the bandwidth and the center frequency of the waveform. There is still overlap of the desired transmit bandwidth but this allows M different states on each side of the waveform (see, e.g., FIG. 5D). These methods can be used for either a single channel, a double redundant single channel, and a two-channel scenario (see, e.g., FIGS. 5C,D) to double communication effectiveness.

Spot jitter and pulse width jitter can be combined for both continuous and non-continuous waveforms such that:

$$Bit_{rate} = PWJ_{rate} + SJ\_rate$$

Figure 4:
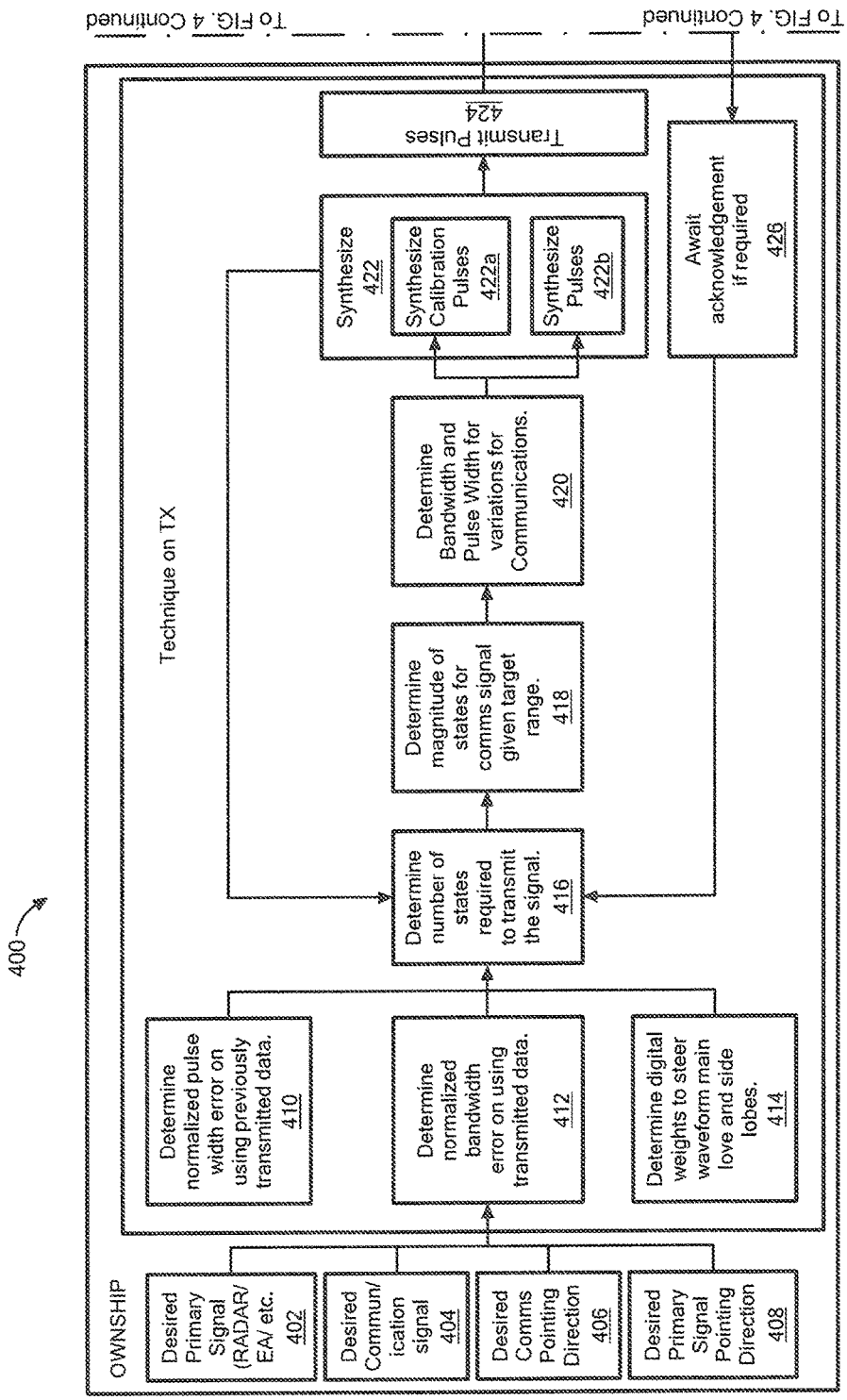
FIG. 4 is a flow diagram showing bandwidth communication.
Figure 4:
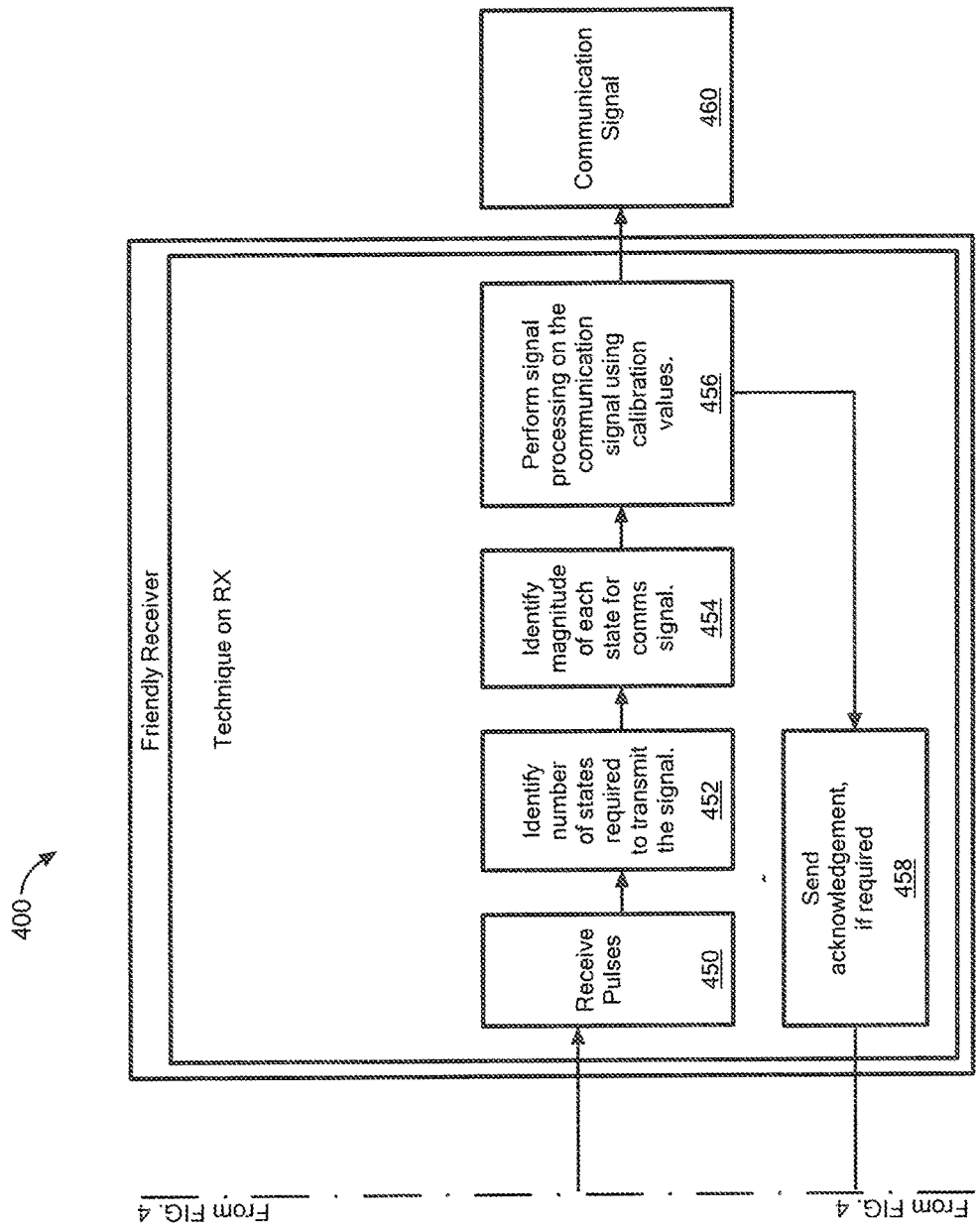

FIG. 4 shows a process to provide bandwidth modulation in accordance with illustrative embodiments of the invention. In embodiments, a receiver has the capability to transmit different types of signals. While processing is described for the various signals, it is understood that in embodiments, only steps for the particular signals may be performed.

In the illustrated embodiment, in 402 a desired primary signal is determined, which can include radar signals, electronic attack (EA), e.g., jamming, etc. In step 404, a desired communication signal is determined. In step 406, a desired communication signal pointing direction is determined. In step 408, desired primary signal pointing directed is determined.

In step 410, the system determines a normalized pulse width error on using previously transmitted data. In step 412, the system determines a normalized bandwidth error on using transmitted data. Steps 410 and 412 can also be used to determine when environmental errors prevented a communication link. Steps 410 and 412 render the system able to adjust the jitter parameters beyond the typical error magnitudes to guarantee the target receiver can disambiguate jitter magnitudes. In step 414, the system determines weights to steer a waveform main and side lobes.

Based on the signal type transmitted and pulse width and/or bandwidth error and steering, the system determines the number of states required to transmit the signal in step 416. In step 418, the system determines the magnitude of states for communication signals for a given target range and receiver capabilities. Step 418 ensures that the waveform has sufficient jitter magnitude (in time and frequency) so that the target system can resolve the transmitted signal from environmental and system interference. Step 418 also determines the number of states required to facilitate the desired communication data. In step 420, the system determines bandwidth, center frequency, and pulse width variations for the desired signal to also contain both sufficient communication jitter characteristics and the original signal characteristics. In step 422, the system synthesizes the signal for transmission including 422a synthesizing calibration pulses and 422b synthesizing pulse for transmission based upon signal variations 420. The synthesized signals from step 422 are then fed back to step 416 to facilitate adaptive adjustments of the pulse jitter. In step 424, the pulses are transmitted. In optional step 426, the system can wait for acknowledgement of the transmitted pulse from the receiver to further drive the jitter magnitudes to gain sufficient jitter SNR at the target receiver to close-link and/or prevent detection.

On the receiver side, in step 450, the transmitted pulses are received. In step 452, the receiver identifies a number of states required for signal transmission and in step 454 identifies a magnitude of each state for communication signals. In step 456, the receiver processes the received communication signal using calibration values. An optional acknowledgment signal can be sent to the transmitter in step 458 to provide adaptive tuning of the jitter parameters by the transmitting system. After signal processing, the communication is signal is provided in step 460.

Figure 5B:
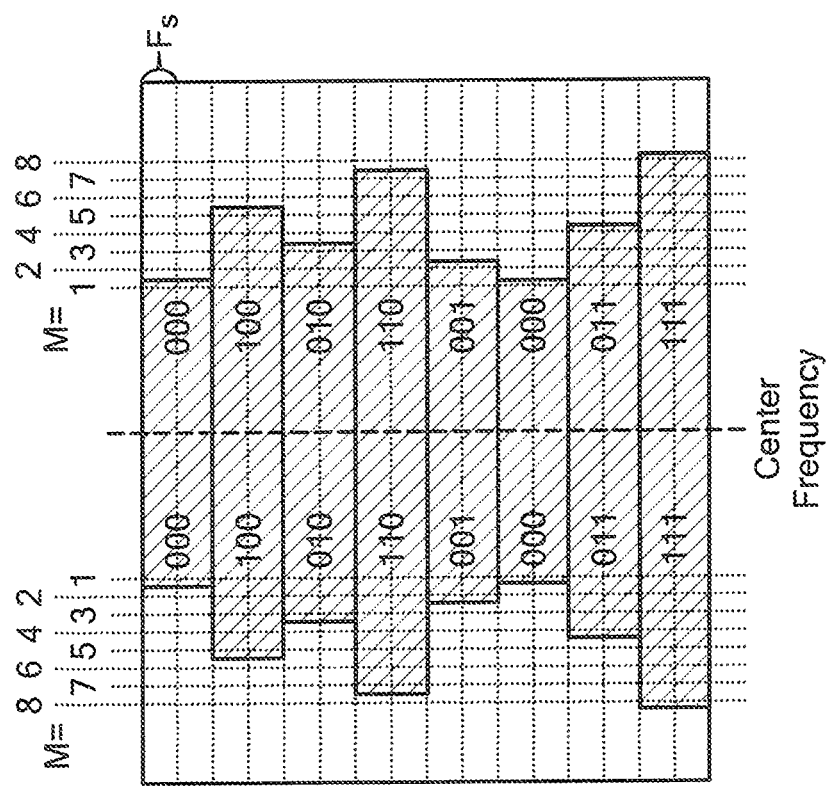
Figure 5A:
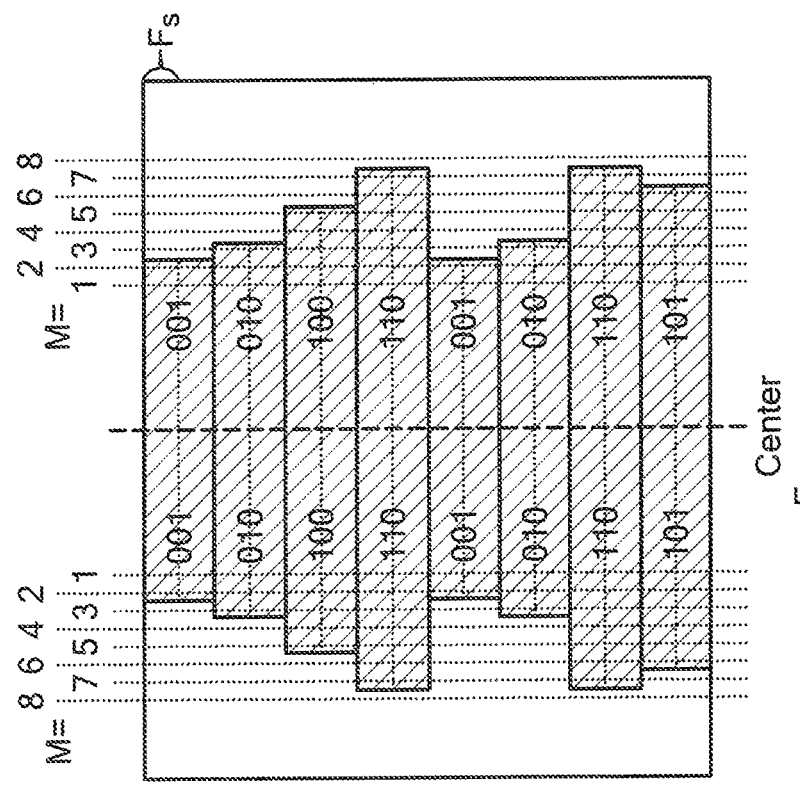

FIGS. 5A-D show a sequence of bandwidth modulation for an illustrative sequence for states 1-M, where M=8 for eight states on both sides of a modulated waveform. FIGS. 5C and 5D show the modulated waveforms of FIGS. 5A and 5B with a modulated center frequency. FIGS. 5A and 5B show a double redundant, single-channel jitter communication during a pulse and FIGS. 5C and 5D shows a dual channel (channel 1 is on the left-hand side and channel 2 is on the right hand side), where the Y axis is time and the X axis is frequency. The illustrative modulation embodiments cover the same desired bandwidth, but each embeds a different example of pulse jitter communications within the shown pulse.

For the illustrative modulation of FIGS. 5C and 5D, first and second channels of communication are provided (one on the left-hand side and another on the right-hand side). First and second channels are enabled by having different jitter values on each side of the transmit signal so as to double communication efficiency.

In embodiments, encrypted information can be transmitted via bandwidth modulation. Because the transmitted signal is a series of bit values, any encryption process can be adopted in pre-processing (on transmit) and post-processing (on receive). In FIG. 5, encryption could be already embedded on transmit; while a decryption device manages the encryption on receive.

Figure 6A:
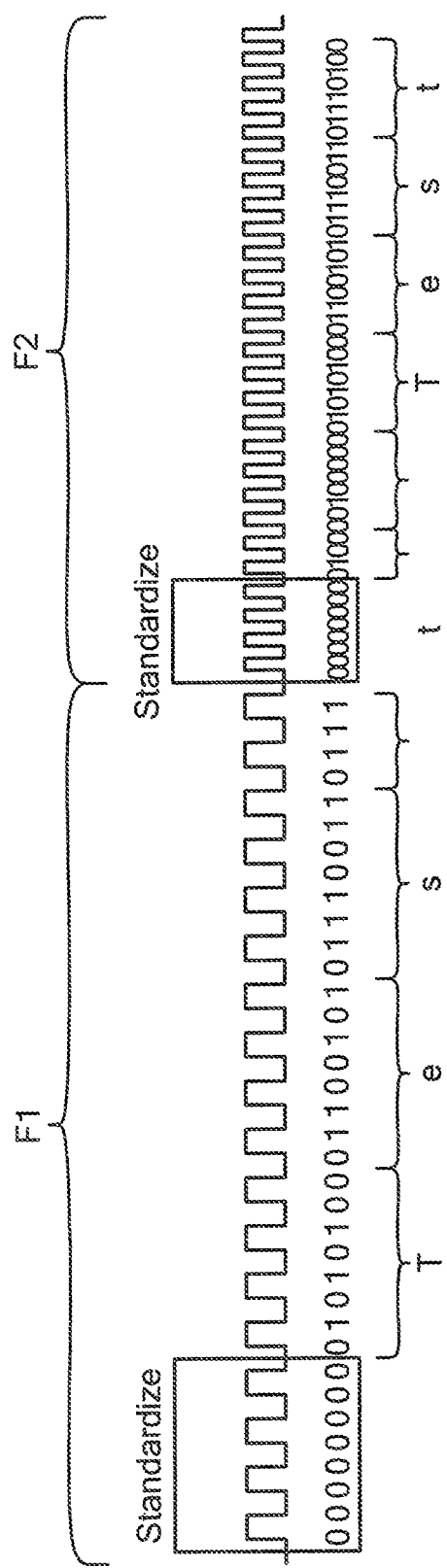
FIGS. 6A, B are schematic representations of illustrative data communication with bandwidth modulation.
Figure 6B:
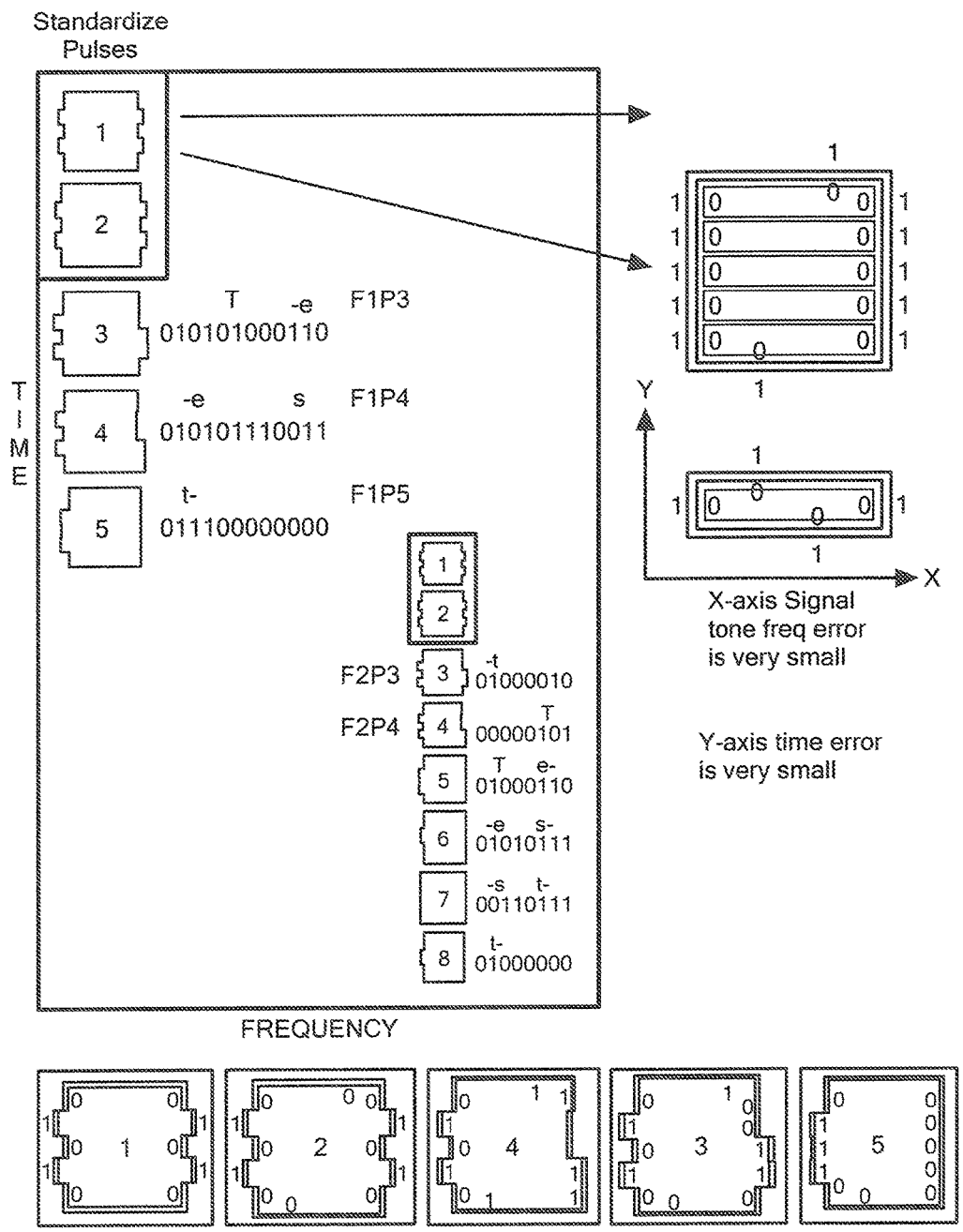

FIG. 6 shows an illustrative pulse jitter test sequence of "Test Test" transmitted using first and second frequencies F1, F2. At the beginning of the sequence and at the beginning of the new frequency, there are a series standardization pulses. Pulse width jitter uses forty-five pulses and non-CW PW/frequency transmission uses thirteen modulation pulses, as shown in FIGS. 6A, 6B. Pulse 1 and pulse 2 are used for standardization. F1P3 includes "T" and half of "e" and F1P4 includes the second half of "e" and "s." F1P5 includes half of "t" and standardization for the new frequency. As can be seen, for the first frequency, each pulse contains 12 bits. For the second frequency, each pulse contains 8 bits.

After standardization, F2P3 includes the second half of "t" and half of " " and F2P4 contains half of " " and half of "T." The remaining 8-bit F2 pulses contain "est."

While the illustrative embodiment is shown as 1 bit/chip, it will be appreciated that throughput increases with multiple chips. In embodiments, the frequency jitter rate is about equal to twice the receiver (or the transmitter clock frequency, whichever is lower) processor clock frequency and the PW data jitter rate is limited to twice the PRF.

It will be appreciated that data jitter as described herein will appear to receivers not 'in the know' as conventional transmit error. If the friendly systems have a more precise clock than unfriendly systems, it may not be possible for the unfriendly systems to detect the data jitter at all. It will be further appreciated that range can work in the favor of friendly systems since the greater the distance the receiver is from the transmitter, the lower the signal-to-noise ratio, and thus, the more difficult to extract the encoded information. In addition, coherent signal processing eliminates the data jitter.

Figures 7A, 7B, 7C:
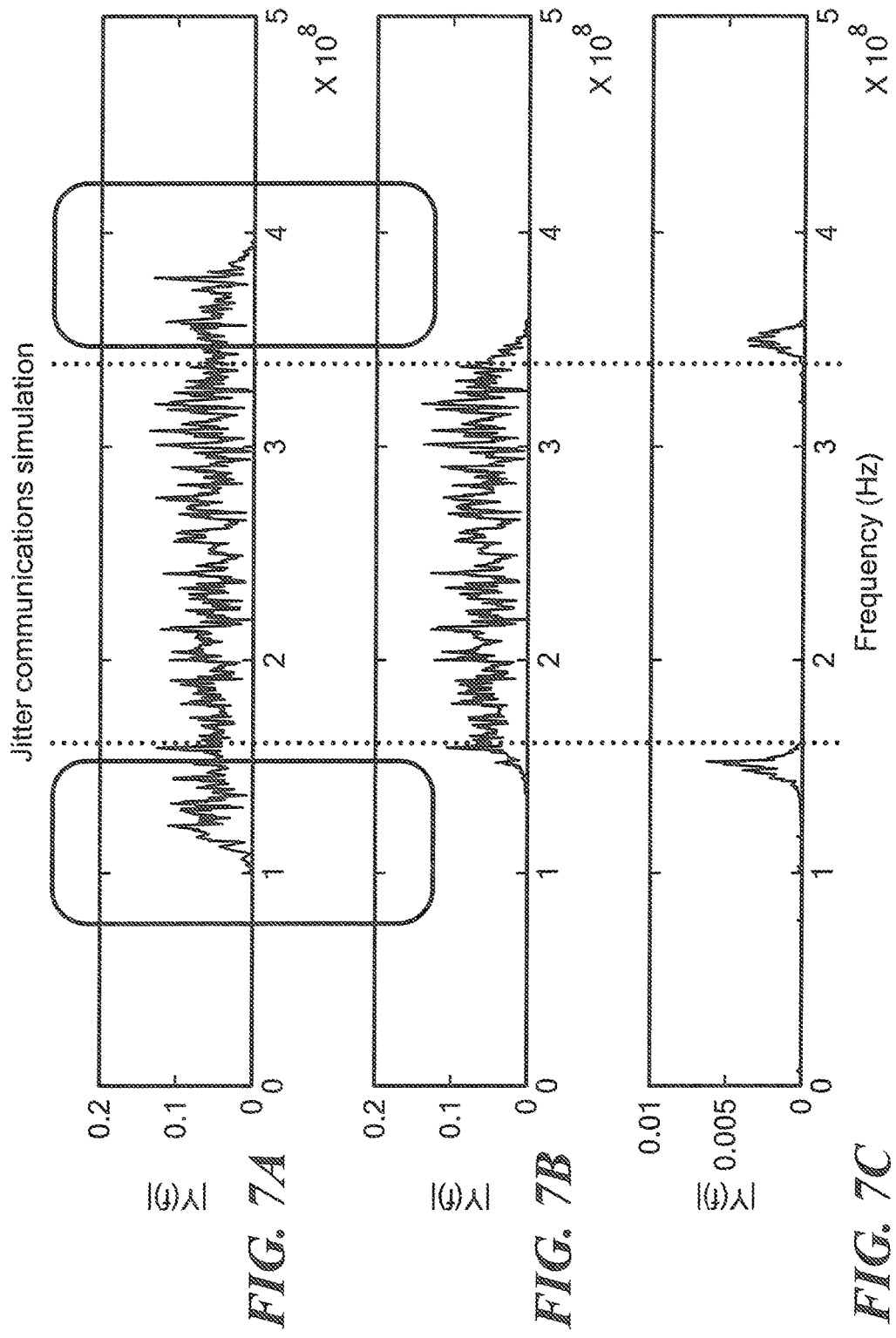
FIGS. 7A-C are a graphical representation of bandwidth modulation signal.

FIGS. 7A-C shows communication information disguised as (an exaggerated for example purposes) jitter on the exterior of an original spot, e.g., outside a 3 dB BW. FIG. 7A shows a FFT of one pulse with data jitter of ONE, FIG. 7B shows a FFT of one pulse with data jitter of ZERO. FIG. 7C shows the pulses resulting from the data jitter of FIG. 7A. FFT and FIR filtering is used by a receiver to detect the inserted data jitter.

Figure 8:
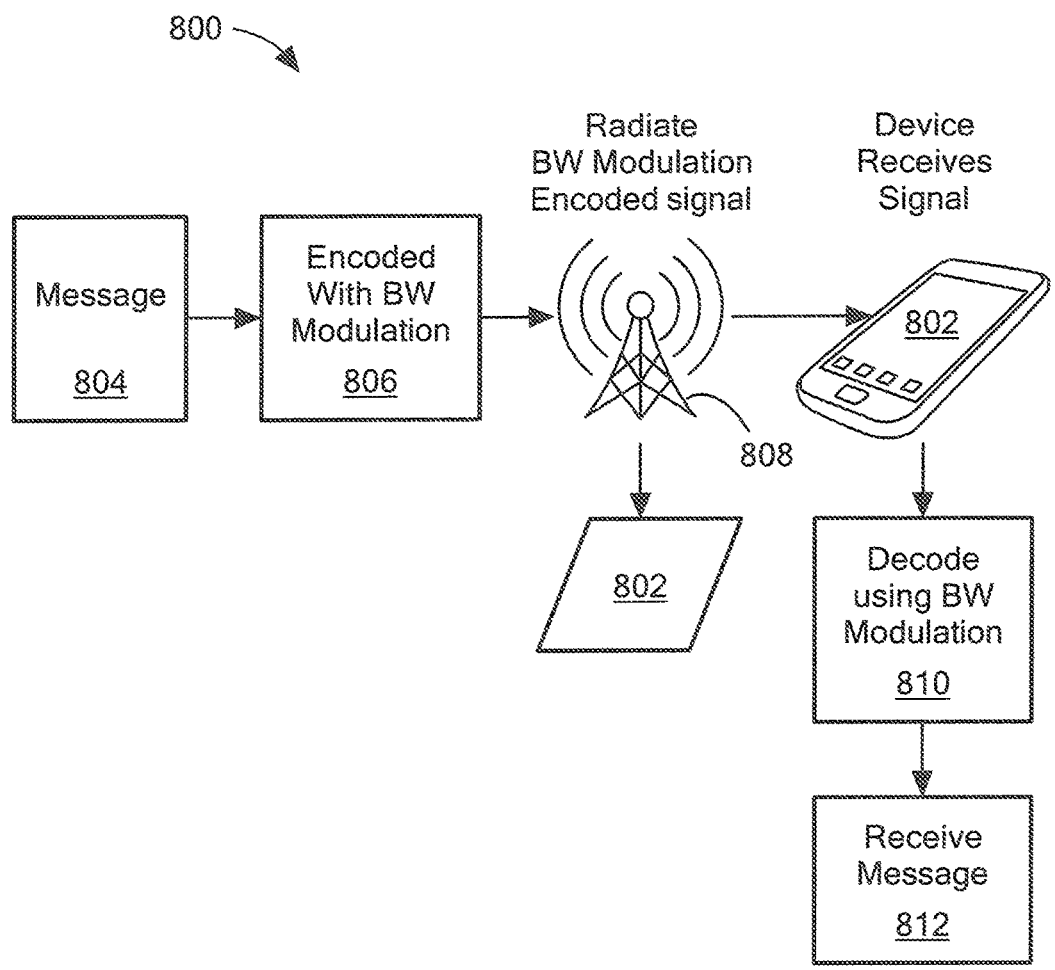
FIG. 8 is a schematic representation of a wireless communication having bandwidth modulation.

FIG. 8 shows an illustrative wireless communication system 800 providing data jitter to a variety of wireless devices 802. Messages 804 are encoded with data jitter using bandwidth modulation 806, as described above. A cell tower 808, for example, transmits the information to the wireless devices 802, which decode the data jitter using known pulse information for bandwidth modulation 810 to provide the received message 812.

Referring again to FIGS. 5A-D, since the signals being shown are not just jamming (but could also be communications, radar, etc.) the same processing is applicable. For this scenario, the communication system uses the entire jittered bandwidth (giving a slightly higher communication rate), while the bits placed on the magnitude of the jitter add additional channels to that communication signal (either pulse width jitter modulation or frequency/BW jitter modulation), further increasing the communication rate by the amount shown in the Bit_rate equation a few pages back.

The result would be approximately:

Bit_Rate=bits/s/hz (of the communication tower)
*BW (desired BW+the jitter bandwidths)+
PWJ_rate+SJ_rate In embodiments, bandwidth modulated data can be transmitted such that only receivers within a certain range can detect the bandwidth modulation It is understood that detection of the bandwidth may depend upon device characteristics, such as receiver clock accuracy. For example, for first and second devices at the same range, only the first device, which has a more accurate clock than the second device, can detect the bandwidth modulated signal. In embodiments, an entity may charge additional costs or fees for devices that can receive, or be enabled to receive, the bandwidth modulation data in addition to data modulated in the conventional way. In other embodiments, additional security may be provided in the bandwidth modulated data. Additionally, in other embodiments the additional channels, provided by the jitter technique, may communicate metadata about the primary signal such as transmit time, conditions for data collection, transmitter location, etc. between capable systems.

Figure 9:
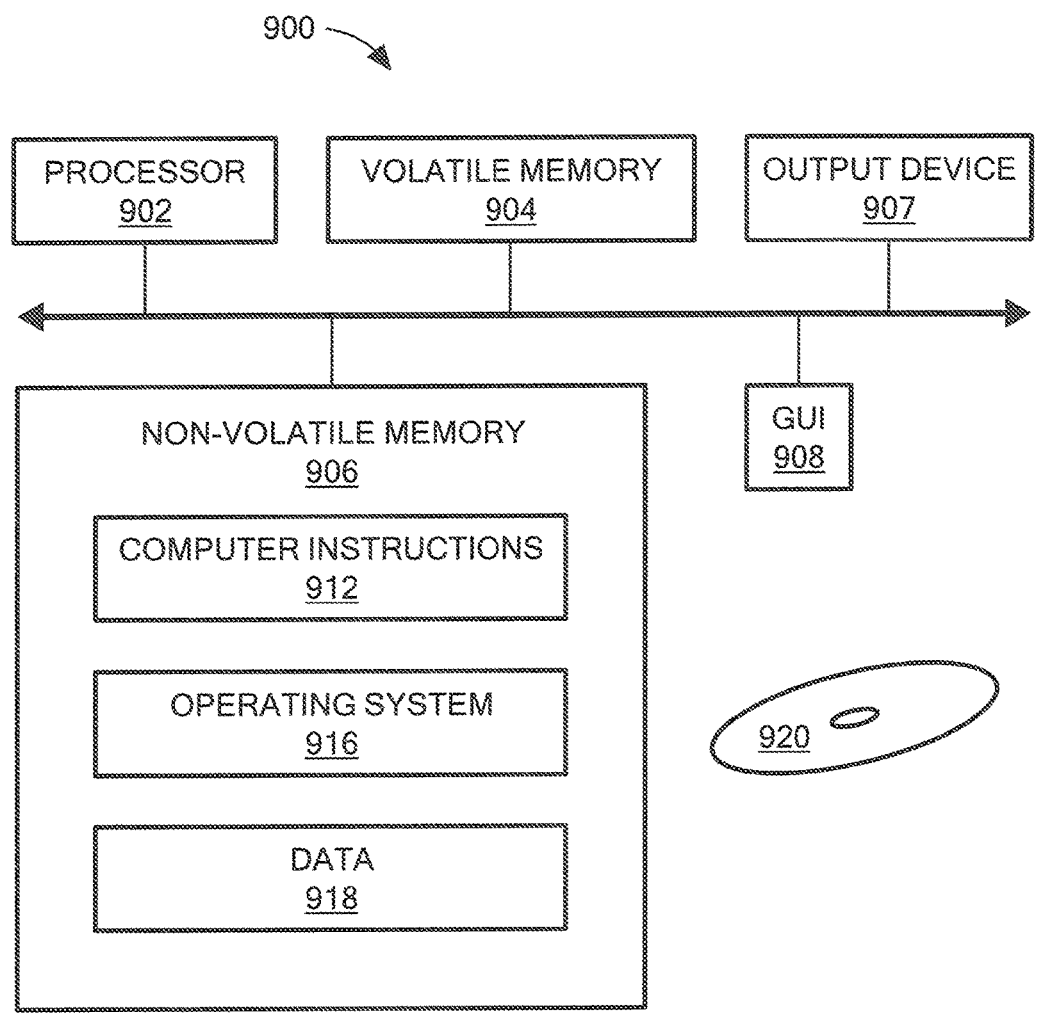
FIG. 9 is a schematic representation of an illustrative computer than can perform at least a portion of the processing described herein.

FIG. 9 shows an exemplary computer 900 that can perform at least part of the processing described herein. The computer 900 includes a processor 902, a volatile memory 904, a non-volatile memory 906 (e.g., hard disk), an output device 907 and a graphical user interface (GUI) 908 (e.g., a mouse, a keyboard, a display, for example). The non-volatile memory 906 stores computer instructions 912, an operating system 916 and data 918. In one example, the computer instructions 912 are executed by the processor 902 out of volatile memory 904. In one embodiment, an article 920 comprises non-transitory computer-readable instructions.

Processing may be implemented in hardware, software, or a combination of the two. Processing may be implemented in computer programs executed on programmable computers/machines that each includes a processor, a storage medium or other article of manufacture that is readable by the processor (including volatile and non-volatile memory and/or storage elements), at least one input device, and one or more output devices. Program code may be applied to data entered using an input device to perform processing and to generate output information.

The system can perform processing, at least in part, via a computer program product, (e.g., in a machine-readable storage device), for execution by, or to control the operation of, data processing apparatus (e.g., a programmable processor, a computer, or multiple computers). Each such program may be implemented in a high level procedural or object-oriented programming language to communicate with a computer system. However, the programs may be implemented in assembly or machine language. The language may be a compiled or an interpreted language and it may be deployed in any form, including as a stand-alone program or as a module, component, subroutine, or other unit suitable for use in a computing environment. A computer program may be deployed to be executed on one computer or on multiple computers at one site or distributed across multiple sites and interconnected by a communication network. A computer program may be stored on a storage medium or device (e.g., CD-ROM, hard disk, or magnetic diskette) that is readable by a general or special purpose programmable computer for configuring and operating the computer when the storage medium or device is read by the computer.

Processing may also be implemented as a machine-readable storage medium, configured with a computer program, where upon execution, instructions in the computer program cause the computer to operate.

Processing may be performed by one or more programmable processors executing one or more computer programs to perform the functions of the system. All or part of the system may be implemented as, special purpose logic circuitry (e.g., an FPGA (field programmable gate array) and/or an ASIC (application-specific integrated circuit)).

Having described exemplary embodiments of the invention, it will now become apparent to one of ordinary skill in the art that other embodiments incorporating their concepts may also be used. The embodiments contained herein should not be limited to disclosed embodiments but rather should be limited only by the spirit and scope of the appended claims. All publications and references cited herein are expressly incorporated herein by reference in their entirety.

Elements of different embodiments described herein may be combined to form other embodiments not specifically set forth above. Various elements, which are described in the context of a single embodiment, may also be provided separately or in any suitable sub-combination. Other embodiments not specifically described herein are also within the scope of the following claims.

What is claimed is:

1. A method of jittering pulse parameters to modulate data onto pulses of a signal, comprising:
communicating data jitter values using frequency bandwidth modulation of pulses by:
determining an original spot having a selected frequency bandwidth for communicating data;
modulating a data jitter value, of the data jitter values, onto an exterior of the original spot for each of the pulses so as to generate an output signal having a frequency bandwidth wider than the selected frequency bandwidth of the original spot, such that the output signal contains the data and the data jitter value, wherein the original spot corresponds to a sum of inherent spot jitter and inherent transmission error; and
transmitting the output signal with a transmitter.

2. The method according to claim 1, further including modulating a center frequency to provide the output signal having first and second channels each having different data jitter values on each side of the output signal for each pulse of the output signal, wherein one of the different data jitter values corresponds to the data jitter value.

3. The method according to claim 1, further including encrypting the output signal.

4. The method according to claim 1, further including determining signal characteristics between the transmitter and a receiver including the inherent spot jitter.

5. The method according to claim 4, further including directing a signal lobe at the receiver.

6. The method according to claim 1, wherein the data jitter value has a corresponding number of states.

7. The method according to claim 1, wherein the signal comprises a continuous waveform signal.

8. The method according to claim 1, further including adjusting the frequency bandwidth of the output signal to achieve a given signal-to-noise ratio.

9. The method according to claim 1, further including determining a number of states for transmitting the output signal.

10. The method according to claim 1, further including receiving the transmitted output signal and demodulating the data jitter value.

11. The method according to claim 1, further including communicating with a receiver to determine the frequency bandwidth of the output signal.

12. The method according to claim 11, further including dynamically adjusting the frequency bandwidth of the output signal.

13. The method according to claim 1, further including modulating a pulse width jitter value onto the signal in a buffer area adjacent to a pulse edge of the signal having inherent jitter to generate the output signal.

14. A system for communicating data jitter values using frequency bandwidth modulation of pulses, comprising:
a processor and memory; and
a module coupled to the processor and configured to communicate the data jitter values using the frequency bandwidth modulation of the pulses by:
determining an original spot having a selected frequency bandwidth for communicating data;
modulating a data jitter value, of the data jitter values, onto an exterior of the original spot for each of the pulses so as to generate an output signal having a frequency bandwidth wider than the selected frequency bandwidth of the original spot, such that the output signal contains the data and the data jitter value, wherein the original spot corresponds to a sum of inherent spot jitter and inherent transmission error.

15. The system according to claim 14, wherein the module is further configured to modulate a center frequency to provide the output signal having first and second channels each having different data jitter values on each side of the output signal for each pulse of the output signal, wherein one of the different data jitter values corresponds to the data jitter value.

16. The system according to claim 14, wherein the module is further configured to modulate a pulse width jitter value onto the signal in a buffer area adjacent to a pulse edge of the signal having inherent jitter to generate the output signal.

17. A system, comprising:
a processor and memory; and
a module coupled to the processor and configured to demodulate a data jitter value encoded onto each pulse of a bandwidth signal using an original spot having a selected frequency bandwidth for communicating data; and
demodulating the data jitter value on an exterior of the original spot for each of the pulses, wherein a received signal has a frequency bandwidth wider than the selected frequency bandwidth of the original spot, such that the received signal contains the data and the data jitter value, wherein the original spot corresponds to a sum of inherent spot jitter and inherent transmission error.

18. The system according to claim 17, wherein the module is further configured to demodulate a center frequency to provide an output signal having first and second channels each having different data jitter values on each side of the output signal for each pulse of the output signal, wherein one of the different data jitter values corresponds to the data jitter value.

19. The method according to claim 1, further including minimizing a frequency bandwidth difference between the selected frequency bandwidth of the original spot and a frequency bandwidth of the output signal.

* * * * *